United States Patent
Kim et al.

(10) Patent No.: US 7,821,304 B2
(45) Date of Patent: *Oct. 26, 2010

(54) SEMICONDUCTOR DEVICE HAVING INPUT CIRCUIT MINIMIZING INFLUENCE OF VARIATIONS IN INPUT SIGNALS

(75) Inventors: Mi Hye Kim, Seoul (KR); Jae Jin Lee, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 95 days.

This patent is subject to a terminal disclaimer.

(21) Appl. No.: 12/138,554

(22) Filed: Jun. 13, 2008

(65) Prior Publication Data
US 2009/0184757 A1 Jul. 23, 2009

(30) Foreign Application Priority Data
Jan. 18, 2008 (KR) .................... 10-2008-0005896

(51) Int. Cl.
*H03B 1/00* (2006.01)
(52) U.S. Cl. .................... 327/108; 327/65; 327/68; 327/89; 327/560; 327/563; 330/262; 330/263
(58) Field of Classification Search .......... None
See application file for complete search history.

(56) References Cited

U.S. PATENT DOCUMENTS

| 5,834,974 | A | * | 11/1998 | Kim | 330/253 |
| 5,892,376 | A | * | 4/1999 | Tabatabai et al. | 327/73 |
| 6,348,815 | B1 | * | 2/2002 | Sim | 326/86 |
| 2009/0184737 | A1 | * | 7/2009 | Kim et al. | 327/108 |

FOREIGN PATENT DOCUMENTS

| KR | 10-0416621 B1 | 1/2004 |
| KR | 1020060023386 A | 3/2006 |
| KR | 10-0656471 B1 | 12/2006 |
| KR | 10-0718044 B1 | 5/2007 |

* cited by examiner

*Primary Examiner*—An T Luu
(74) *Attorney, Agent, or Firm*—Ladas & Parry LLP

(57) ABSTRACT

A semiconductor device stabilizes an operation of an input buffer. A semiconductor device includes an input potential detection unit, an input buffer, and a current sink unit. The input potential detection unit outputs a detection signal in response to a level of an input signal. The input buffer buffers the input signal by differentially amplifying the input signal through a first current sink unit. The current sink unit receives the detection signal, and in response to the detection signal, performs an auxiliary differential amplifying operation with respect to the input signal buffered by the input buffer.

22 Claims, 6 Drawing Sheets

Input potential crossing point(vref+a)

SEMICONDUCTOR DEVICE HAVING INPUT CIRCUIT MINIMIZING INFLUENCE OF VARIATIONS IN INPUT SIGNALS

CROSS-REFERENCE TO RELATED APPLICATIONS

The present application claims priority to Korean patent application number 10-2008-005896 filed on Jan. 18, 2008, which is incorporated herein by reference in its entirety.

BACKGROUND OF THE INVENTION

The present invention relates to a semiconductor device, and more particularly to an input circuit of a semiconductor device that ensures stable operation.

A typical semiconductor device includes a signal transferring unit that receives and transfers a signal, and a signal processing unit that processes the signal transferred by the signal transferring unit according to a unique predetermined operation.

Typically, a signal processing unit is referred to as the core circuit of the semiconductor device, and as many devices as the current design and processing technology will allow are integrated in the core circuit.

The signal transferring unit is provided with an input circuit for transferring an external signal to the signal processing unit within a semiconductor device and an output circuit for outputting data transferred from the signal processing unit to outside.

In a semiconductor device, particularly in a semiconductor memory device, the input circuit typically receives an external address signal or data, and the input circuit transfers the external address signal or data to an internal memory core region. The output buffer outputs a data signal corresponding to the inputted address signal.

The input circuit that transfers the external data signal or address signal to the internal memory core region should perform an accurate buffering operation, since a semiconductor device can reliably operate only when accurate buffering is ensured.

Figure 1:
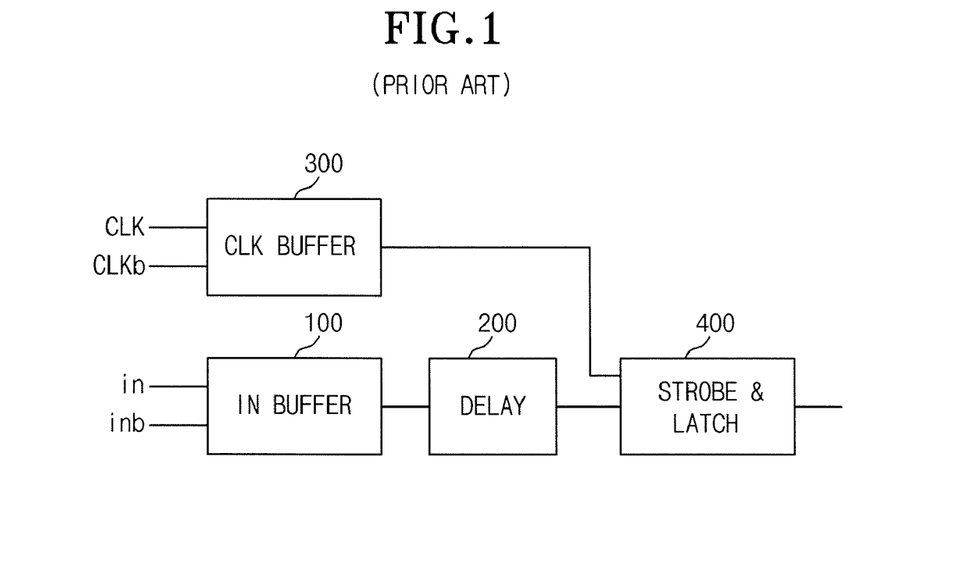
FIG. 1 is a block diagram showing a conventional input circuit.

FIG. 1 is a circuit diagram showing a conventional input circuit of a semiconductor device. In a typical semiconductor memory device, the input circuit has a differential amplifier structure. The configuration shown in FIG. 1 is an example of a DRAM, which is typical semiconductor memory device.

The circuit in FIG. 1 includes an input buffer 100 receiving input signals in and inb, a delaying circuit 200 delaying the output signal of the input buffer 100, a clock buffer 300 receiving clock signals CLK and CLKB, and a strobe & latch circuit 400 receiving the output of the delaying circuit 200 and the output signal of the clock buffer 300.

Generally, the input buffer 100 has a structure that differentially amplifies the input signals in and inb, and is a circuit receiving an external signal such as an address in a semiconductor memory device, a control signal, or the like.

The delaying circuit 200 is a circuit for adjusting the timing (i.e. a setup time or a hold time) used to synchronize the input signals in and inb (examples of the input signal being an address, a control signal, or the like) with a clock.

The clock buffer 300 is a circuit for receiving the system clock signals CLK and CLKB which are inputted from outside.

The strobe & latch circuit 400 is a strobe circuit for clock synchronization.

The input circuit in FIG. 1 has a differential input buffer structure for receiving a differential signal. Herein, the differential input refers to signals having opposite phases, such as clocks CLK and CLKB.

When the differential input (i.e. input signals in and inb) are inputted into the input buffer 100, the input buffer 100 differentially amplifies the input signals in and inb. The crossing point of this differential input (the point at which the signal in and the signal inb cross) is referred to as VIX.

Herein, the level of the crossing point VIX is typically a Vref level, e.g. VCC/2. However, there may be situations where the level of the crossing point VIX is not adjusted to the exact Vref level due to influences such as noise, etc.

Even in situations in which the crossing point VIX is higher or lower the Vref level, the reaction speed of the output signal must have a constant reaction speed or the input circuit will not have stable operation. However, when the input potential is low, a delay in the output signal will typically occur, and thus the setup time and the hold time vary a great deal. Therefore, the input circuit does not operate in a stable manner.

Figure 2:
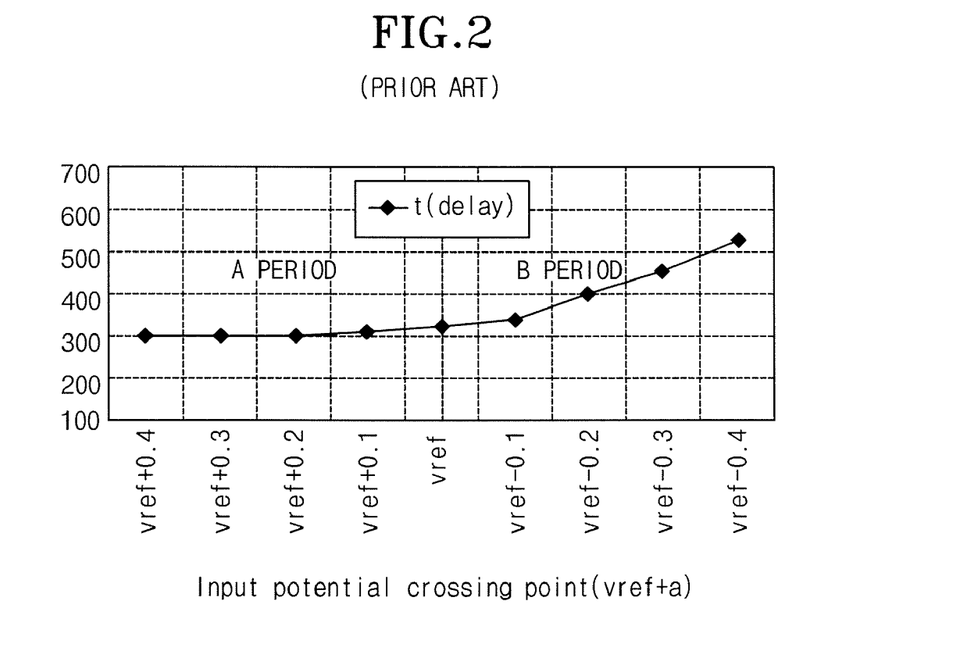
FIG. 2 is a graph shown for illustrating operation properties of the input buffer shown in FIG. 1.

FIG. 2 is a graph illustrating variation in operation speed of the input buffer 100 according to variation in the input potentials of the input signals in and inb of FIG. 1. FIG. 1 also shows variation in the extent of delay 't' according to the variation in the input potentials of the input signals in and inb is shown. Herein, 't' is the time it takes for the input signals in and inb to be inputted into the input buffer 100 and then outputted from the input buffer 100. The variation pattern or of the amount of variation in 't' may be different depending on the type of input buffer 100.

Figure 3:
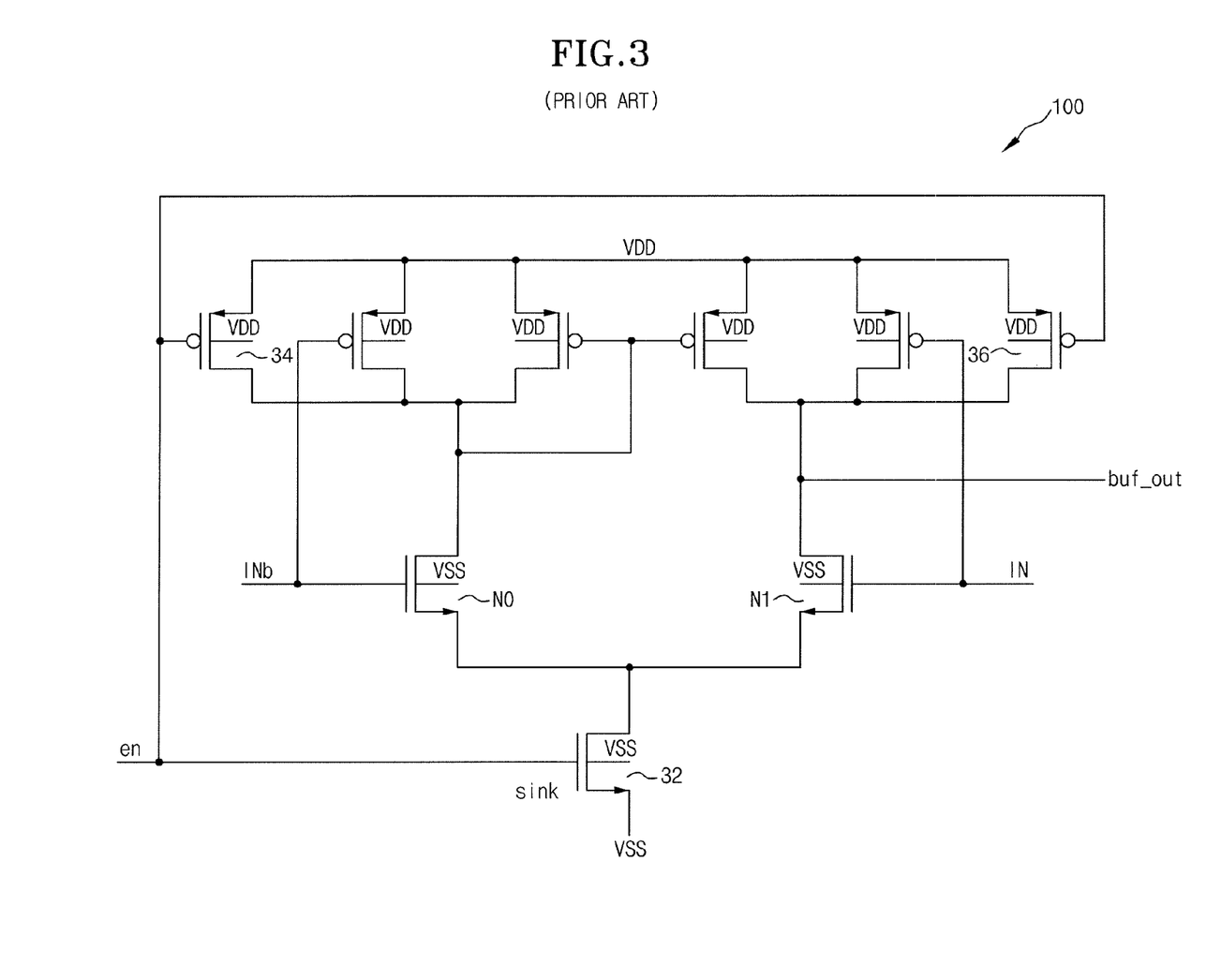
FIG. 3 is a circuit diagram of the input buffer shown in FIG. 1.

FIG. 3 shows an input buffer 100 having a differential amplifying structure that has the properties illustrated in FIG. 2.

Referring to FIG. 3, when an enable signal en has a high the input buffer 100 is enabled. A driving transistor 32 is turned on when the enabling signal has a high level to operate the input buffer 100. Herein, when the input buffer 100 is described as operating, the input buffer 100 compares and amplifies the levels of the input signals in and inb to output as a buffer output signal buf_out.

The enable signal en is input at a logic low level when the input buffer 100 is disabled and the driving transistor 32 is turned off. When the enable signal en is disabled, the input buffer 100 does not compare the input signals in and inb, and in this case the input buffer 100 outputs a constant high level buffer output signal buf_out since PMOS transistors 34 and 36 receive the enable signal en having the low level via their respective gates. Fixing the buffer output signal buf_out at a high level prevents the node that outputs the buffer output signal buf_out from being floated when the input buffer 100 is in the disabled state.

Referring again to FIG. 2, A period in FIG. 2 is a period in which the crossing point VIX is higher than the reference voltage level, and B period is a period in which the crossing point VIX is lower than the reference voltage level. When compared to the A period, the 't' value of the B period is greater. As shown in FIG. 2, when the input levels of the input signals in and inb are low, the setup time and the hold time vary a large degree due to the delay of the output signal, and thus the input buffer does not operate in a stable manner.

Voltage differences Vgs between the gate and source of NMOS transistors N0 and N1 in FIG. 3 become lower than a threshold voltage Vth when the level of the input voltage of the input buffer lowers. Therefore, a period in which the NMOS transistors N0 and N1 are turned off is generated, and the input buffer does not operate normally. As a consequence, malfunctions occur in the semiconductor memory device.

SUMMARY OF THE INVENTION

There is provided a semiconductor integrated circuit that minimizes the influence of variations in the level of input signals in an input buffer thereby stabilizing operation.

Additionally, there is provided a semiconductor integrated circuit that controls the driving ability of an input buffer in response to the level of an input signal thereby ensuring stable operation.

In one embodiment of the present invention, a semiconductor device comprises: an input potential detection unit outputting a detection signal according to a level of an input signal; an input buffer buffering the input signal by differentially amplifying the input signal through current sink; and a current sink unit performing an auxiliary differential amplifying operation with respect to the input signal buffered by the input buffer in response to the detecting signal.

Preferably, the input potential detection unit includes a reference voltage generation unit generating a reference voltage; an input unit transmitting the reference voltage according to the level of the input signal; and an output control unit outputting the transmitted reference voltage as the detection signal when an enable signal is activated.

Preferably, the input unit transmits the reference voltage when the level of the input signal is lower than a predetermined level.

Preferably, the enable signal is an enable signal of the input buffer.

Preferably, the input buffer is driven in response to an activated enable signal.

Preferably, the current sink unit includes a low input potential driving transistor connected to a driving node of the input buffer and driving the auxiliary differential amplifying of the input buffer in response to the detection signal.

Preferably, the low input potential driving transistor includes a NMOS transistor driven in response to an activated detection signal.

According to another embodiment of the present invention, a semiconductor device comprises: an input potential detection unit outputting a detection signal according to a level of an input signal; and a current sink unit buffering and outputting the input signal by differentially amplifying the input signal using current sink and performing an auxiliary differential amplifying operation with respect to the output signal according to a level of the detection signal.

Preferably, the input potential detection unit includes a reference voltage generation unit generating a reference voltage; an input unit transmitting the reference voltage according to the level of the input signal; and an output control unit outputting the reference voltage transmitted from the input signal as the detection signal when an enable signal is activated.

Preferably, the input unit transmits the reference voltage when the level of the input signal is lower than a predetermined level.

Preferably, the input buffer is provided with a low input potential driving transistor performing auxiliary differential amplification of the output signal according to the level of the detection signal.

Preferably, the low input potential driving transistor includes a NMOS transistor driven in response to an activated detection signal.

According to another embodiment of the present invention, a semiconductor device comprises: an input potential detection unit outputting a detection signal according to a level of an input signal; an input buffer buffering the input signal by differentially amplifying the input signal through a current sink transistor; and a multiplexer controlling the current sink of the input buffer according to a level of the detection signal of the input potential detection unit.

Preferably, the input potential detection unit includes a reference voltage generation unit generating a reference voltage; an input unit transmitting the reference voltage according to the level of the input signal; and an output control unit outputting the reference voltage transmitted from the input signal as the detection signal when an enable signal is activated.

Preferably, the multiplexer includes a control unit supplying the detection signal; a first voltage supply unit supplying a power voltage to an output line according to the level of the detection signal and an enable signal; and a second voltage supply unit supplying a boost voltage higher than the power voltage to the output line according to the level of the detection signal.

Preferably, the boost voltage is a pumping voltage VPP.

According to another embodiment of the present invention, a semiconductor device comprises: an input potential detection unit outputting a detection signal according to a level of an input signal; an input buffer buffering the input signal by differentially amplifying the input signal through a current sink transistor; and a multiplexer controlling the current sink transistor of the input buffer according to a level of the detection signal of the input potential detection unit.

Preferably, the input potential detection unit includes a reference voltage generation unit generating a reference voltage; an input unit transmitting the reference voltage according to the level of the input signal; and an output control unit outputting the reference voltage transmitted from the input signal as the detection signal when an enable signal is activated.

Preferably, the multiplexer includes a control unit supplying the detection signal; a first voltage supply unit supplying a power voltage to an output line according to the level of the detection signal and an enable signal; and a second voltage supply unit supplying a boost voltage higher than the power voltage to the output line according to the level of the detection signal.

Preferably, the boost voltage is a pumping voltage VPP.

According to another embodiment of the present invention, a semiconductor device comprises: an input potential detection unit outputting a detection signal according to a potential level of an input signal; and a multiplexer buffering the input signal by performing a differential amplifying operation through a current sink transistor and controlling the current sink transistor according to the level of the detection signal.

Preferably, the input potential detection unit includes a reference voltage generation unit generating a reference voltage; an input unit transmitting the reference voltage according to the level of the input signal; and an output control unit outputting the reference voltage transmitted from the input signal as the detection signal when an enable signal is activated.

Preferably, the multiplexer includes a control unit supplying the detection signal; a first voltage supply unit supplying a power voltage to an output line according to the level of the detection signal and an enable signal; and a second voltage supply unit supplying a boost voltage higher than the power voltage to the output line according to the level of the detection signal.

Preferably, the boost voltage is a pumping voltage VPP.

According to the present invention, it is possible to minimize the influence of voltage level variation in an input signal; and thus, the present invention stabilizes the operation of a semiconductor integrated circuit by supplementing the driving of the input buffer with an auxiliary differential amplifying.

DESCRIPTION OF SPECIFIC EMBODIMENTS

Hereinafter, preferred embodiments of the present invention will be described in detail with reference to the accompanying drawings.

In an input circuit of a semiconductor device according to an embodiment of the present invention, less current is consumed when the level of potential of input signals (including address, various control signals, and data) is high, and the input circuit operates in a stable manner even when the level of potential of the input signals is low, thereby stabilizing circuit operation as a whole.

In an embodiment of the present invention, a semiconductor integrated circuit is provided with an input potential detection unit for outputting a detection signal corresponding to the level of an input signal; and an input buffer including a buffer circuit for performing a differential amplifying operation using a first current sink unit to buffer the input signal, and a second current sink unit for performing a differential amplifying operation on the input signal of the buffer circuit and the detection signal of the input potential detection unit in response to the level of the detection signal.

In the above configuration, the second current sink unit may be designed integrally with the input buffer or separately from the input buffer.

Figure 4:
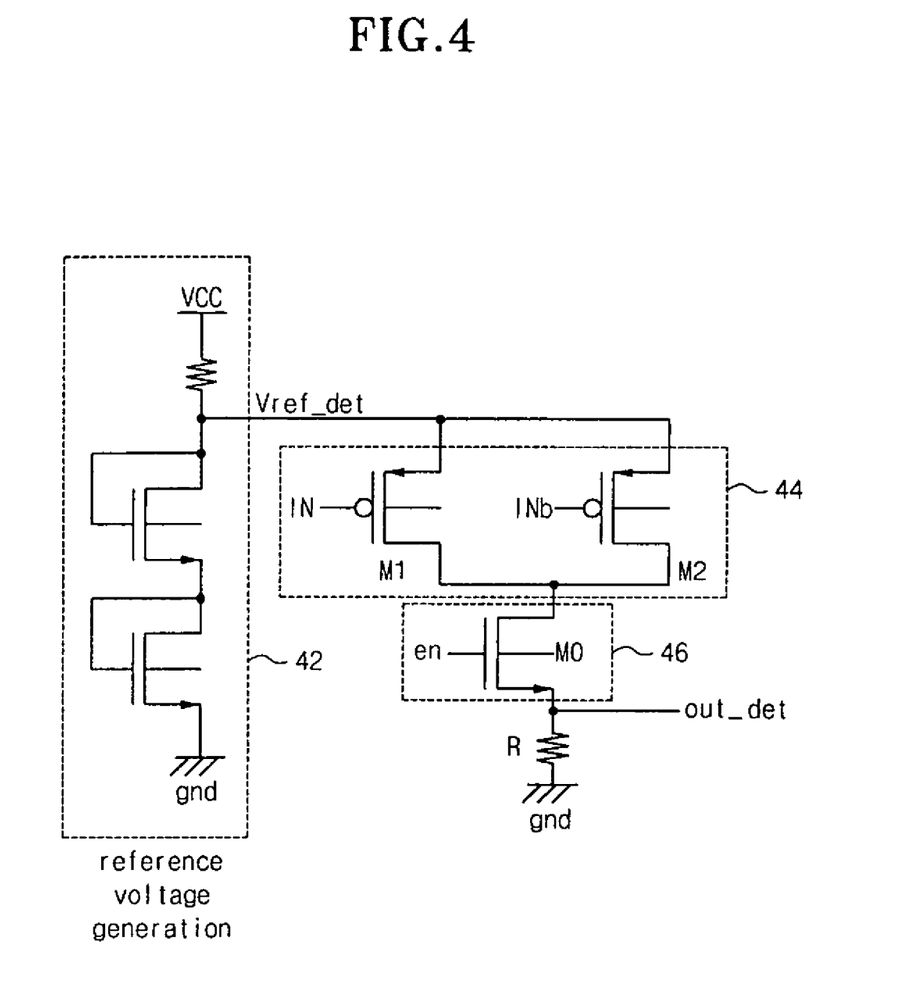
FIG. 4 is a circuit diagram showing an example of an input potential detection unit according to the present invention.

FIG. 4 is a circuit diagram showing an example of an input potential detection unit according to the present invention.

Referring to FIG. 4, the input potential detection unit includes a reference voltage generation unit 42 generating a reference voltage Vref_det, an input unit 44 transmitting the reference voltage Vref_det in response to the level of input signals IN and INb, and an output control unit 46 outputting the reference voltage Vref_det transmitted via the input unit 44 as a detection signal out_det in response to the activation of an enable signal en.

The input unit 44 transmits the reference voltage Vref_det if the level of the input signals IN and INb is lower than a predetermined level (the level is determined as a product specification). The enable signal en is a signal for enabling the input buffer. The reference voltage generation unit 42 may be realized using a constant voltage generation circuit.

The input unit 44 may include a PMOS transistor M1 receiving the input signal IN via its gate, and a PMOS transistor M2 receiving the input signal INb via its gate. The output control unit 46 may include a NMOS transistor M0 receiving the input buffer enable signal en via its gate.

The input potential detection unit having the configuration shown in FIG. 4 operates as follows.

The level of the reference voltage Vref_det outputted from the reference voltage generation unit 42 is a value that varies according to the configuration and design of the reference voltage generation circuit. An enable signal en (which is a signal input to the NMOS transistor M0 of the output control unit 46) is a signal identical to the input buffer enable signal.

The enable signal en is in a logic high state when the input buffer is in an enable state, and is in a logic low state when the input buffer is in a disable state. When the enable signal is in a high state, the circuit in FIG. 4 (i.e. the input potential detection unit) operates. On the other hand, when the enable signal is in a low state, the NMOS transistor M0 configuring the output control unit 46 is turned off and the detection signal out_det is fixed at a low level.

During the operation of the input potential detection unit shown in FIG. 4, when the PMOS transistors M1 and M2 of the input unit 44 receive input signals IN and Inb having a high level, the detection signal out_det becomes a low level. When the input signals IN and INb have a low level, the detection signal out_det becomes a high level.

Figure 5:
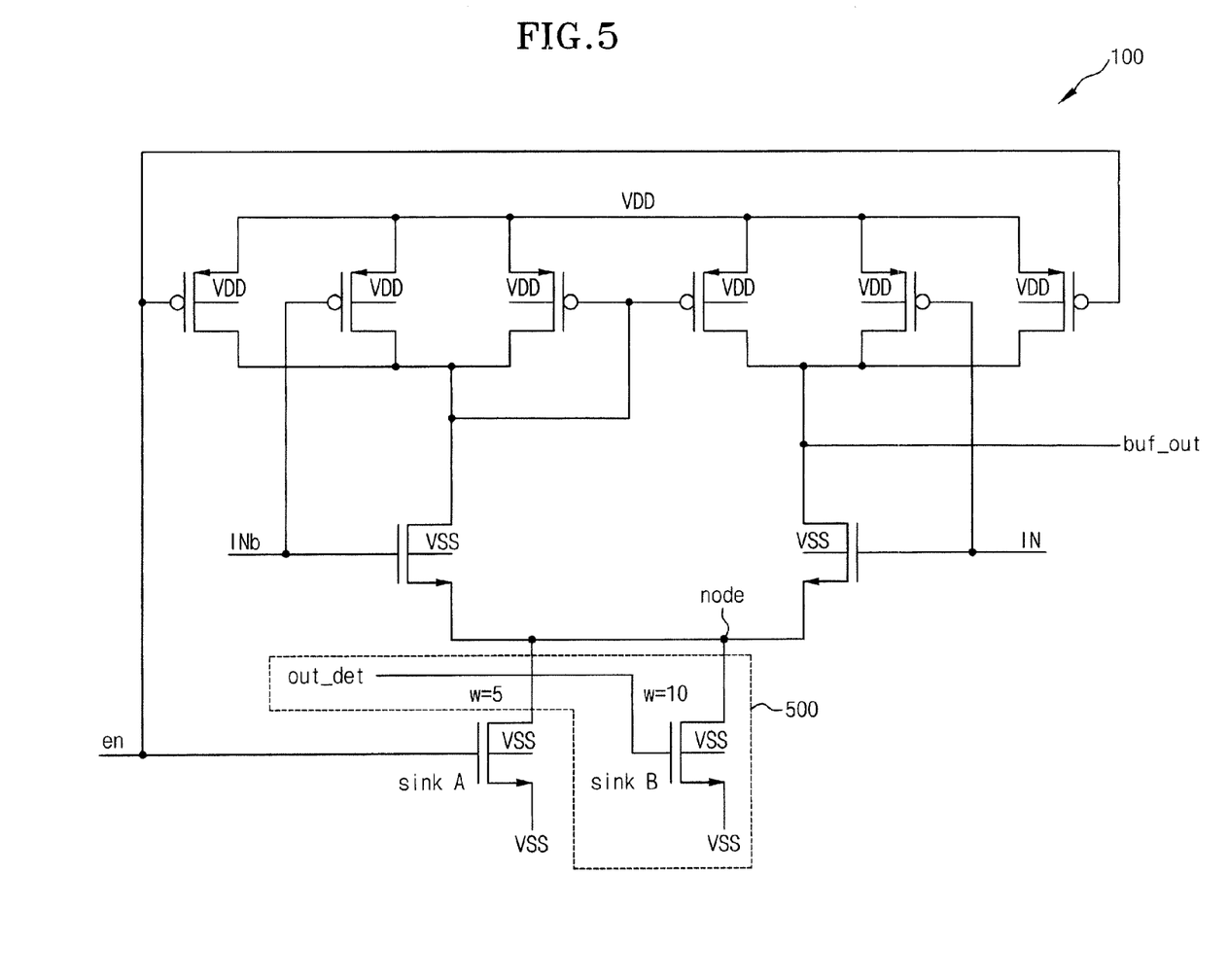
FIG. 5 is a circuit diagram showing a first example of an input buffer according to the present invention.

FIG. 5 is a circuit diagram showing an example of an input buffer having a second current sink unit according to the present invention. In the drawing, the reference numeral 100 denotes a buffer circuit having a conventional differential amplifying structure, and the reference numeral 500 denotes the second current sink unit according to the present invention.

In FIG. 5, the buffer circuit 100 has a circuit configuration identical to that shown in FIG. 3 which is described above, and thus is given the same reference numeral. Herein, the input buffer may include both the buffer circuit 100 and the second current sink unit 500; alternatively, the input buffer may include the buffer circuit 100 alone, and the second current sink unit 500 may be a separate component.

In the configuration in FIG. 5, the buffer circuit 100 is a buffer that differentially amplifies the input signals IN and INb. The buffer circuit 100 is driven in response to an activated enable signal en.

The second current sink unit 500 includes a low input potential driving transistor sinkB connected to a driving node 'node' of the input buffer 100, and the low input potential driving transistor sink B drives auxiliary differential amplification of the buffer circuit 100 in response to the detection signal out_det. The low input potential driving transistor sinkB includes an NMOS transistor driven in response to an activated detection signal out_det.

Referring to FIG. 5, transistors sinkA and sinkB are for current sink. The transistor sinkA receives the enable signal en via its gate (as is in the conventional circuit), and the transistor sinkB receives the detection signal out_det (which is an output of the input potential detection unit in FIG. 4) via its gate.

In general, current flowing through a transistor is proportional to the width of the transistor, and the speed of a buffer is proportional to the current. The speed of the buffer is increased as the width of the transistor is increased.

For example, assuming that the width of the transistor sinkA is 5 and the width of the transistor sinkB is 10, when the buffer circuit 100 is enabled and the input voltages IN and INb of the buffer circuit 100 have values greater than the reference voltage, the result is <en='H', out_det='L'>-><sinkA=on, sinkB=on> and current corresponding to I(sink) flows.

On the other hand, when the input voltages IN and INb of the buffer circuit 100 have values smaller than the reference voltage, the result is <en='H', out_det='H'>-><sinkA=on, sinkB=on>, and current corresponding to three times I(sink) flows. This accelerates the speed of the buffer circuit 100 and reduces the delay time 't' when compared to the former.

That is, the delay (which typically increases with the reduction in the input voltage) of the buffer circuit 100 is reduced during the following operational sequence: "out_det='H'-> current increased->buffer speed increased->'t' reduced".

When the buffer circuit 100 is in a disable state, en and out_det become a low level, and the PMOS transistors receiving the enable signal en via their gate are turned on to prevent the output buf_out of the buffer circuit 100 from being floated. In other words, when the buffer circuit 100 is disabled, the level of the output buf_out is fixed at a high level to prevent floating.

Figure 6:
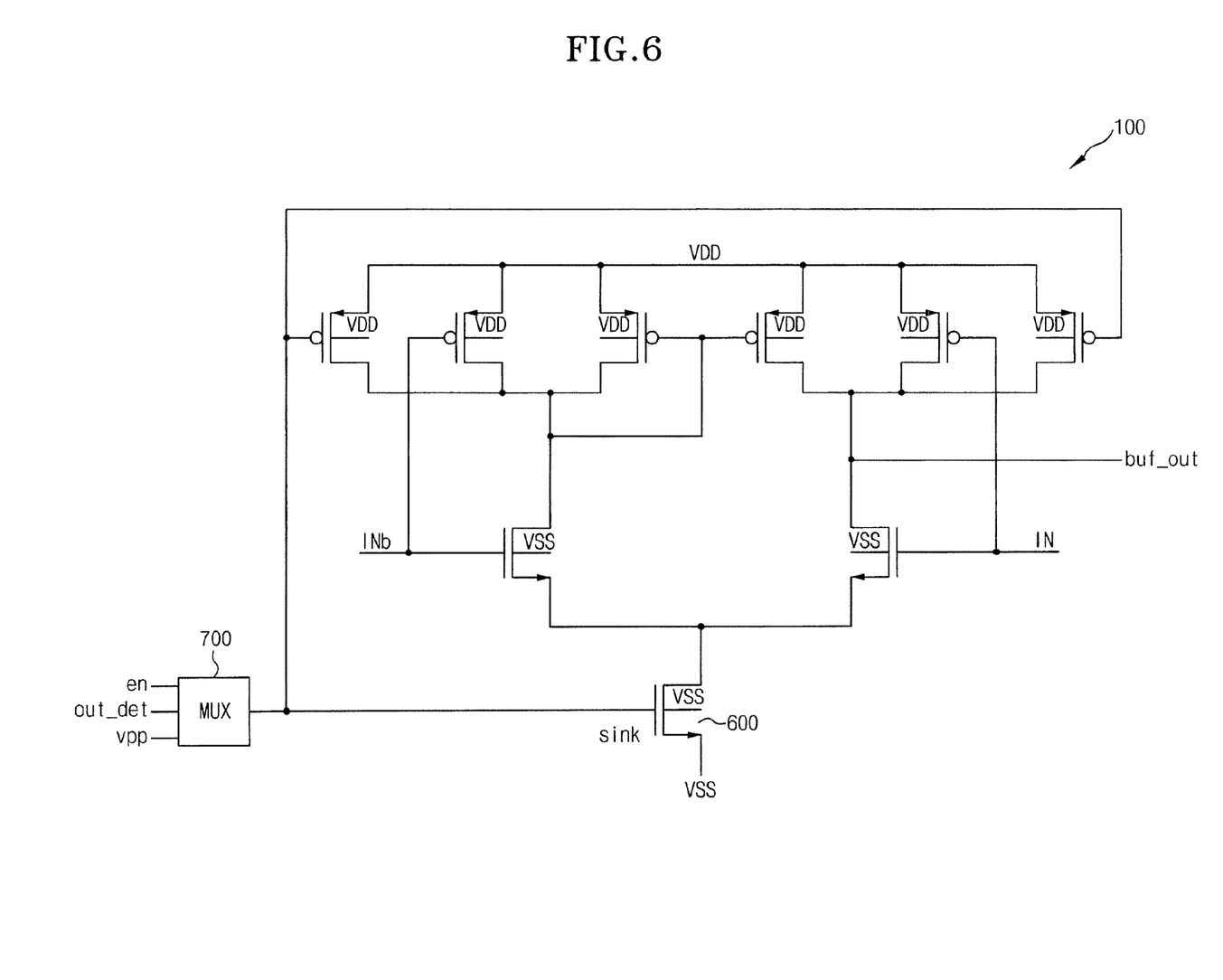
FIG. 6 is a circuit diagram showing a second example of an input buffer according to the present invention.

FIG. 6 is a circuit diagram showing a second example of an input buffer according to an embodiment of the present invention. The input buffer in FIG. 6 includes a buffer circuit 100 performing a differential amplifying operation through a current sink transistor 600 to buffer the input signal; and a multiplexer 700 receiving both the detection signal out_det of the input potential detection unit and the enable signal en, and controlling the current sink transistor 600 of the buffer circuit 100 in response to the level of the detection signal out_det.

Figure 7:
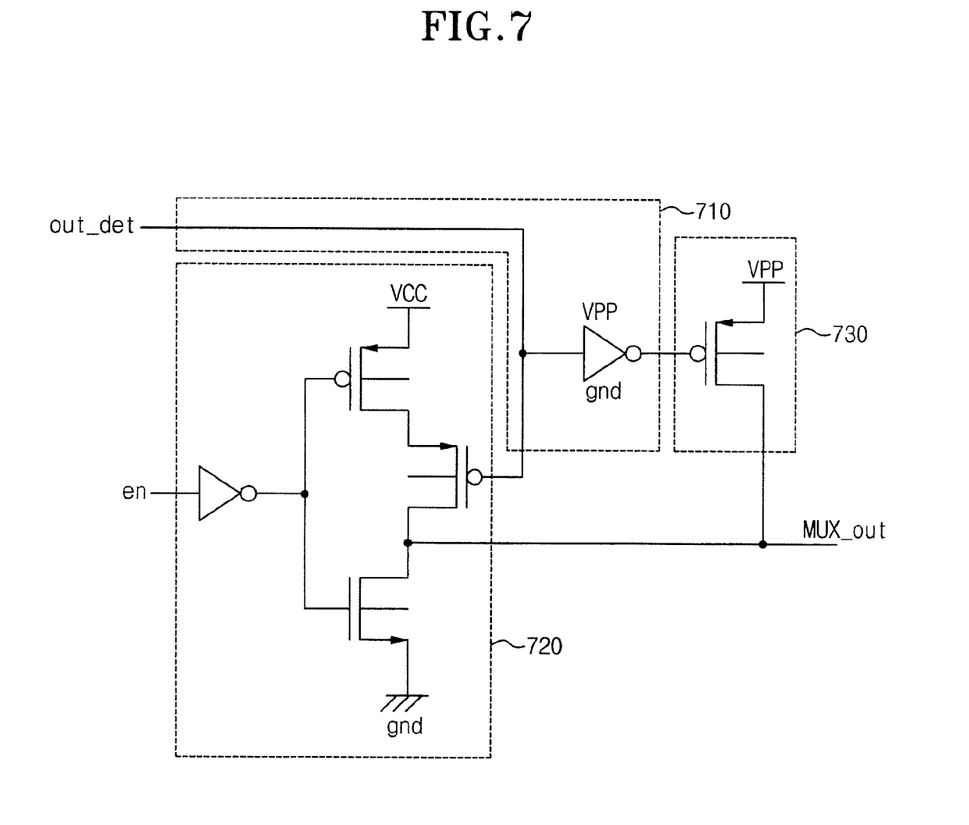
FIG. 7 is a detailed circuit diagram of the multiplexer shown in FIG. 6.

FIG. 7 is a detailed circuit diagram of the multiplexer 700 shown in FIG. 6. The multiplexer 700 shown in FIG. 7 includes a control unit 710 supplying the detection signal out_det; a first voltage supply unit 720 supplying a power voltage VCC to an output line mux_out in response to the input of the detection signal out_det and the enable signal en; and a second voltage supply unit 730 supplying a boost voltage higher than the power voltage VCC to the output line mux_out in response to the input of the detection signal out_det. The boost voltage may be a pumping voltage VPP.

The operation of the second example will now be explained with reference to FIGS. 6 and 7.

While the circuit shown in FIG. 5 (the first example according to an embodiment of the present invention) controls current by varying the width of the sink transistor, the second example according to an embodiment of the present invention shown in FIGS. 6 and 7 controls current by varying the input voltage of the sink transistor.

In general, current of a transistor is proportional to the square of the gate input voltage of the transistor.

A multiplexer uses a select signal to select one input from various inputs to output the selected input.

Referring to FIGS. 6 and 7, when the buffer circuit 100 is enabled and the input of the buffer circuit 100 is high, the result is <en='H', out_det='L'>, and the output signal of the multiplexer 700 becomes the level of the power voltage VCC. When the buffer circuit 100 is enabled and the input voltage of the buffer circuit 100 is low, the result is <en='H', out_det='H'>, and the output signal of the multiplexer 700 becomes the level of the boost voltage VPP. The boost voltage VPP (i.e. pumping voltage) is higher than the power voltage VCC.

Meanwhile, when the buffer circuit is disabled, the result is <en='L', out_det='L'>, and the output signal of the multiplexer 700 becomes a ground level.

For example, in FIG. 6, if VCC=1.5V, VPP=1.7V, gnd=0V and the input voltage is high, the current is the square of $\{k*(1.5V-VTH)\}$. When the input voltage is low, the current is the square of $\{k*(1.7V-VTH)\}$. Herein, k is a constant that corresponds to the properties of the transistor and VTH is a threshold voltage. As such, it becomes possible to control skew by varying the gate input voltage of the sink transistor according to the input voltage of the buffer circuit 100, thereby stabilizing circuit operation.

In the present invention, it is possible to ensure that the buffer circuit operates in a stable manner, and also to ensure that the output of the input buffer is stabilized by: turning on the second current sink unit 500 that performs the auxiliary differential amplifying operation or driving the current sink transistor using the boost voltage VPP when the input potential is low, and thus stable operation of a DRAM or another semiconductor integrated circuit is ensured.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A semiconductor device, comprising:
    an input potential detection unit outputting a detection signal according to a level of an input signal using a reference voltage;
    an input buffer buffering the input signal by differentially amplifying the input signal through a current sink operation; and
    a current sink unit performing an auxiliary differential amplifying operation in response to the detection signal, wherein the input potential detection unit comprises:
    a reference voltage generation unit generating the reference voltage;
    an input unit transmitting the reference voltage according to the level of the input signal; and
    an output control unit outputting the transmitted reference voltage as the detection signal when an enable signal is activated.

2. The semiconductor device as set forth in claim 1, wherein the input unit transmits the reference voltage when the level of the input signal is lower than a predetermined level.

3. The semiconductor device as set forth in claim 1, wherein the enable signal is an enablement signal for enabling the input buffer.

4. The semiconductor device as set forth in claim 1, wherein the input buffer is driven when the enable signal is activated.

5. The semiconductor device as set forth in claim 1, wherein the current sink unit includes a low input potential driving transistor connected to a driving node of the input buffer, the low input potential driving transistor receiving the detection signal and driving the auxiliary differential amplifying of the input buffer in response to the detection signal.

6. The semiconductor device as set forth in claim 5, wherein the low input potential driving transistor includes an NMOS transistor driven in response to an activated detection signal received via a gate of the NMOS transistor.

7. A semiconductor device, comprising:
    an input potential detection unit outputting a detection signal according to a level of an input signal using a reference voltage; and
    a current sink unit buffering and outputting the input signal by differentially amplifying the input signal using a current sink operation and performing an auxiliary differential amplifying operation according to a level of the detection signal wherein the input potential detection unit comprises:
a reference voltage generation unit generating the reference voltage;
an input unit transmitting the reference voltage according to the level of the input signal; and
an output control unit outputting the transmitted reference voltage as the detection signal when an enable signal is activated.

8. The semiconductor device as set forth in claim 7, wherein the input unit transmits the reference voltage when the level of the input signal is lower than a predetermined level.

9. The semiconductor device as set forth in claim 7, wherein the current sink unit includes a low input potential driving transistor performing the auxiliary differential amplification of the input signal according to the level of the detection signal.

10. The semiconductor device as set forth in claim 9, wherein the low input potential driving transistor includes an NMOS transistor driven when the detection signal is activated.

11. A semiconductor device, comprising:
an input potential detection unit outputting a detection signal according to a level of an input signal;
an input buffer buffering the input signal by differentially amplifying the input signal through a current sink transistor; and
a multiplexer controlling a current sink operation of the input buffer according to a level of the detection signal.

12. The semiconductor device as set forth in claim 11, wherein the input potential detection unit comprises:
a reference voltage generation unit generating a reference voltage;
an input unit transmitting the reference voltage according to the level of the input signal; and
an output control unit outputting the transmitted reference voltage as the detection signal when an enable signal is activated.

13. The semiconductor device as set forth in claim 11, wherein the multiplexer comprises:
a control unit receiving and supplying the detection signal;
a first voltage supply unit receiving the detection signal from control unit and supplying a power voltage to an output line according to the level of the detection signal and an enable signal; and
a second voltage supply unit receiving the detection signal from the control unit and supplying a boost voltage higher than the power voltage to the output line according to the level of the detection signal,
wherein the current sink transistor receives one of the power voltage and the boost voltage from the output line according to the level of the detection signal to control the current sink operation.

14. The semiconductor device as set forth in claim 13, wherein the boost voltage is a pumping voltage VPP.

15. A semiconductor device, comprising:
an input potential detection unit outputting a detection signal according to a level of an input signal;
an input buffer buffering the input signal by differentially amplifying the input signal through a current sink transistor; and
a multiplexer controlling the current sink transistor of the input buffer according to a level of the detection signal.

16. The semiconductor device as set forth in claim 15, wherein the input potential detection unit comprises:
a reference voltage generation unit generating a reference voltage;
an input unit transmitting the reference voltage according to the level of the input signal; and
an output control unit outputting the transmitted reference voltage as the detection signal when an enable signal is activated.

17. The semiconductor device as set forth in claim 15, wherein the multiplexer comprises:
a control unit receiving and supplying the detection signal;
a first voltage supply unit receiving the detection signal from the control unit and supplying a power voltage to an output line according to the level of the detection signal and an enable signal; and
a second voltage supply unit receiving the detection signal from the control unit and supplying a boost voltage higher than the power voltage to the output line according to the level of the detection signal,
wherein the current sink transistor receives one of the power voltage and the boost voltage from the output line according to the level of the detection signal.

18. The semiconductor device as set forth in claim 17, wherein the boost voltage is a pumping voltage VPP.

19. A semiconductor device, comprising:
an input potential detection unit outputting a detection signal according to a potential level of an input signal; and
a multiplexer buffering the input signal by performing a differential amplifying operation through a current sink transistor and controlling the current sink transistor according to the level of the detection signal.

20. The semiconductor device as set forth in claim 19, wherein the input potential detection unit comprises:
a reference voltage generation unit generating a reference voltage;
an input unit transmitting the reference voltage according to the level of the input signal; and
an output control unit outputting the transmitted reference voltage as the detection signal when an enable signal is activated.

21. The semiconductor device as set forth in claim 19, wherein the multiplexer comprises:
a control unit receiving and supplying the detection signal;
a first voltage supply unit receiving the detection signal from the control unit and supplying a power voltage to an output line according to the level of the detection signal and an enable signal; and
a second voltage supply unit receiving the detection signal from the control unit and supplying a boost voltage higher than the power voltage to the output line according to of the level of the detection signal,
wherein the current sink transistor receives one of the power voltage and the boost voltage from the output line according to the level of the detection signal.

22. The semiconductor device as set forth in claim 21, wherein the boost voltage is a pumping voltage VPP.

* * * * *